United States Patent
Ragg (10) Patent No.: US 9,693,446 B2
(45) Date of Patent: Jun. 27, 2017

(54) CIRCUIT BOARD WITH THERMAL CONTROL

(71) Applicant: Endress+Hauser Conducta Gesellschaft fur Mess- und Regeltechnik mbh+Co. KG, Weil am Rhein (DE)

(72) Inventor: Thomas Ragg, Sachsenheim (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 216 days.

(21) Appl. No.: 14/566,126

(22) Filed: Dec. 10, 2014

(65) Prior Publication Data

US 2015/0173173 A1 Jun. 18, 2015

(30) Foreign Application Priority Data

Dec. 13, 2013 (DE) .......... 10 2013 114 006

(51) Int. Cl.
 *H05K 1/02* (2006.01)
 *H05K 7/20* (2006.01)

(52) U.S. Cl.
 CPC ........... *H05K 1/0212* (2013.01); *H05K 7/205* (2013.01); *H05K 1/0206* (2013.01); *H05K 2203/1115* (2013.01)

(58) Field of Classification Search
 CPC . H01L 23/345; H01L 23/4018; H05K 1/0206; H05K 1/0207; H05K 1/0212; H05K 1/0201; H05K 1/0204; H05K 1/115; H05K 1/167; H05K 2203/1115; H05K 3/341; H05K 7/20; H05K 7/20854; H05K 3/30; H05K 3/4038; H05K 7/2039; H05K 7/205; H05B 3/28; H05B 3/26
 See application file for complete search history.

(56) References Cited

U.S. PATENT DOCUMENTS 5,539,186 A * 7/1996 Abrami ............ H01L 23/34 174/262
5,831,333 A * 11/1998 Malladi ............ H01L 23/34 165/80.2

(Continued)

FOREIGN PATENT DOCUMENTS

DE 2354719 5/1975
DE 2362567 6/1975

(Continued)

OTHER PUBLICATIONS

English translation of abstract for DE2354719, May 15, 1975.

(Continued)

*Primary Examiner* — Courtney Smith
*Assistant Examiner* — Michael Matey
(74) *Attorney, Agent, or Firm* — Christopher R. Powers; PatServe (57) ABSTRACT

A printed circuit board comprises a base material containing at least one conductor path and at least one heat-conducting path forming a heating layer embedded in the base material for generating and conducting heat. The circuit board is characterized in that the heat-conducting path comprises a PTC thermistor with a constant voltage applied thereto. The invention further relates to a plug-in module comprising such a circuit board, and additionally to a field device comprising such a circuit board and/or such a plug-in module.

21 Claims, 4 Drawing Sheets

(56) References Cited

U.S. PATENT DOCUMENTS

| | | | |
|---|---|---|---|
| 7,720,555 B2 | 5/2010 | Staiger | |
| 7,923,830 B2 * | 4/2011 | Pope | H01L 23/49816 |
| | | | 174/261 |
| 8,522,049 B1 * | 8/2013 | Ahmadi | G06F 21/86 |
| | | | 713/193 |
| 9,125,301 B2 * | 9/2015 | Sloane | H05K 1/0212 |
| 2004/0112884 A1 * | 6/2004 | Uhl | B60H 1/034 |
| | | | 219/202 |
| 2006/0065431 A1 * | 3/2006 | Trucco | H05K 1/0212 |
| | | | 174/250 |
| 2006/0152329 A1 * | 7/2006 | Bjorsell | H01C 1/1406 |
| | | | 338/22 R |
| 2010/0231155 A1 * | 9/2010 | Schmidt | G01K 1/16 |
| | | | 318/473 |
| 2012/0105096 A1 * | 5/2012 | Kuah | G01R 31/2812 |
| | | | 324/763.01 |
| 2012/0119872 A1 * | 5/2012 | Leung | H01C 17/265 |
| | | | 338/25 |
| 2012/0133427 A1 * | 5/2012 | Kim | H01L 23/34 |
| | | | 327/564 |
| 2013/0094148 A1 * | 4/2013 | Sloane | H05K 1/0212 |
| | | | 361/708 |
| 2013/0180973 A1 | 7/2013 | White | |
| 2014/0099529 A1 * | 4/2014 | Ishikawa | H01M 2/0285 |
| | | | 429/126 |
| 2014/0131847 A1 * | 5/2014 | Yee | H05K 1/0209 |
| | | | 257/675 |
| 2015/0053462 A1 * | 2/2015 | Wu | H05K 1/0206 |
| | | | 174/252 |
| 2015/0245481 A1 * | 8/2015 | Brunner | H05K 1/0306 |
| | | | 361/760 |

FOREIGN PATENT DOCUMENTS

| | | |
|---|---|---|
| DE | 29621801 | 3/1998 |
| DE | 19640959 | 4/1998 |
| DE | 102005062421 | 6/2007 |

OTHER PUBLICATIONS

English translation of abstract of DE2362567, Jun. 19, 1975.
English translation of abstract of DE19640959, Apr. 9, 1998.
English translation of abstract of DE102005062421, Jun. 28, 2007.

* cited by examiner

CIRCUIT BOARD WITH THERMAL CONTROL

REFERENCE TO RELATED APPLICATION

This application claims priority to German patent application No. DE 102013114006.8, filed Dec. 13, 2013, the entire content of which is incorporated herein by reference.

FIELD OF THE INVENTION

This invention relates generally to printed circuit boards and plug-in modules and, in particular, to a field device comprising such a circuit board and/or such a plug-in module.

BACKGROUND OF THE INVENTION

A printed circuit board (PCB) is a support for electronic components. PCBs are used for mounting items mechanically and for making electrical connections. Virtually every electronic device comprises one or more printed circuit boards. Printed circuit boards are made of electrically insulating material having attached conductive materials called conductor paths. A common insulating material is fiber-reinforced plastic. The conductors are usually etched from a thin layer of copper.

Examples of electronic devices are electron tubes, semiconductor diodes, transistors, integrated circuits, resistors, capacitors and inductors. An integrated circuit (IC) is an electronic circuit housed on one single (semiconductor) substrate circuit consisting of electronic devices that are interconnected together. The main feature of integrated circuits is a large number of different types or same active and passive components and connecting conductive paths on or in a single-crystal substrate. A distinction is made based on the type of signal as digital, analog or mixed ICs. Typical ICs are data memory storage devices, processors, logic ICs, ASICs, DSPs, microcontrollers, D/A and A/D converters and others.

Most examples of ICs comprise the same starting material. Silicon is used as the substrate material in the majority of instances (gallium arsenide is used in special situations). Silicon is an elemental semiconductor. By using suitable dopants such as boron or arsenic, certain properties in silicon—especially conductivity—can be altered, and most importantly, can be amplified. Silicon's properties, however, are highly dependent on temperature. At low temperature, the semiconductor crystal acts as an isolator, i.e. it has no movable charge carriers. As the temperature increases, the number of open charge carriers increases, which in turn increases conductivity. Manufacturers of electronic components often specify $-40°$ C. as the lowest limit for functionality.

In process automation technology, particularly when automating chemical or process engineering processes and/or when automating processes in order to control industrial systems, process-oriented installed measuring devices and field devices are used. Configured field devices can act as sensors to monitor process metrics such as pressure, temperature, flow, level or measures of measurement variables for fluid and/or gas analysis such as pH, conductivity, concentrations of certain ions, chemical compounds and/or concentrations or partial pressures of gases.

Frequently, a plurality of different types of sensors are used in a process installation. A sensor installed at a particular installation location, e.g. an installed sensor configured at a particular installation location for detecting one or more measurement variables, may be combined with a transmitter to function as a measuring point.

A sensor generally has a transmitter which is adapted to detect the measured variable to be monitored and to generate an electric measurement signal correlated to the measurement variable's current value. In order to further process the measurement signal, an electronic circuit is used that is configured to further prepare the electrical measurement signal, e.g. to digitize it, to convert it into a measurement value for the measurement variable and/or into a variable derived from the measurement value, and to optionally output it to a superordinate unit. The circuit may include other functions in addition to creating and/or forwarding a measurement value. The circuit can, for example, be adapted to carry out additional evaluations on the measurement values or to run a sensor diagnosis, during which the sensor's current state is detected, and a prediction is made regarding the sensor's remaining service life. The circuit may be arranged wholly or partially in the transmitter.

Field devices are required in various industries and applications. In extracting oil and gas, the US, Canada and Russia are the main producing countries. Here, the oil and gas reserves are often in very cold areas where temperatures can often fall below $-50°$ C. As already mentioned, under certain conditions, electrical circuits sometimes fail at these temperatures.

One conventional way of dealing with low temperatures is to wrap field devices that have to be used at very low outdoor temperatures in insulating material and heat them from the outside. The disadvantage of doing this is that an additional power supply is required to supply this heat, which can necessitate a lot of added time and expense. In addition, the field device loses its compact design. Also, the insulation material might cover or hide the control or signaling units.

Applying heat to a printed circuit board also ends up heating it very unevenly. Furthermore, some components on the circuit board generate heat themselves (e.g. processors). Heat distribution is thus irregular, giving rise to "hot spots", i.e. points that become very warm—even hot—while some spots remain cold. These temperature gradients can subject the components to mechanical stress, and in extreme cases, can cause the components to detach from the printed circuit board.

DE 10 2005 062 421 A1 contains a description for a heater for a field device display module, wherein the heater comprises a heating element. The heating element is adapted to the shape of the field-device display module and is configured to convert electric current into heat energy. The heating element can be coupled to the field device display module to keep it warm.

DE 10 2013 108 531 describes a field device with a heating element and a control. It includes a temperature measuring unit that determines the temperature in the vicinity of a temperature-sensitive component, and the control activates the heater so that the ambient temperature for temperature-sensitive component remains above a predetermined threshold. Since the heater control itself mainly consists of electronic components, options are limited for starting the heating element by setting it to start when temperatures fall below the operating temperature.

EP 3 371 645 shows a heater that is embedded in a printed circuit board to melt solder on the board. The heater is made of copper with a layer of magnetically permeable material. A high-frequency current is constantly applied to the heater. US 2006/0065431 shows a similar structure, where again, a constant current is applied to a heater on a printed circuit board in order to melt solder in order to create an electrical contact for components without having to use a reflow oven.

Published US Application 2013/0180973 shows a circuit board having a top conductive layer and a lower conductive layer. A plurality of electronic components is mounted on at least one of the layers. A heating layer consisting of horizontal and vertical heating structures is provided between the two conductive layers to generate heat and to transport the electronic component. A current is applied to the heating structures, which in turn generates heat. The heating structure is a conductive copper layer.

SUMMARY OF THE INVENTION

The object of this invention is to heat electronic components from a cold state to a specific temperature, in particular, to a desired operating temperature, and to maintain this temperature without a separate control.

This object is achieved using a printed circuit board comprising a base material containing at least one conductor path, and at least one heat-conducting path on a heating layer embedded in the base material for generating and conducting heat. The circuit board is characterized in that the heat-conducting path comprises a positive temperature coefficient (PTC) thermistor, and wherein a constant voltage is applied to the heat-conducting path.

Typically the component layer is the top or bottom layer of the PCB; alternatively, however, the components can be arranged on an inner layer of the PCB.

BRIEF DESCRIPTION OF THE DRAWINGS

The invention is explained in greater detail with reference to the following figures.

DETAILED DESCRIPTION OF THE INVENTION

In the figures, the same features are identified by the same reference numerals, as follows:

LIST OF REFERENCE NUMERALS

1 PCB
1.part Component layer
1.heat Heating layer
1.heat-a Heating layer
1.heat-b Heating layer
2 Electrical component
3 Conductor path
4 Contact
5 Thermal via
5.StdT State of the art thermal via
6 Base material
7 Heat-conducting path
8 Plug-in module
9 PTC thermistor
10 Plug-in module
11 Heat-conducting path
20 Field device
21 Sensor
22 Interface
23 Interface
24 Cable
25 Door
26 Data processing unit
V1 First voltage
V2 Second voltage A PTC thermistor (or PTC resistor) is a device including a material that conducts current more efficiently at lower temperatures than at high temperatures. The electrical resistance increases as the temperature rises. In theory, all metals have a positive temperature coefficient, and so can be considered PTC thermistors; however, in contrast to "real" PTC thermistors, their temperature coefficient is substantially smaller. For the purposes of this application, only "real" PTC thermistors should be considered a PTC thermistor. Therefore, for our purposes, copper, gold, silver, aluminum, nickel, tantalum, iron, lead, tungsten and platinum should be explicitly excluded. PTC thermistors are usually made of semiconducting polycrystalline ceramics. One example of this is barium titanate ($BaTiO_3$), which is a mixture of barium carbonate and titanium (IV) oxide. Alternatively, PTC thermistors are silicon-based. The temperature coefficient for "real" PTC thermistors can be up to about 50× greater than in metals, i.e. on the order of 3-30%/° C.

As mentioned, thermistor resistance varies with the temperature. If a constant voltage is applied to the thermistor and the temperature is around −60° C., then resistance is minimal—a heavy amount of current flows and produces a rather significant amount of heat. If the component heats up, resistance increases, and less heat is produced. Once the component and the immediate surroundings reach a certain temperature, a balance is created between the amount of heat produced (voltage and flowing current applied respectively) and outflowing heat. A certain temperature can thus be set by applying a certain constant voltage. The amount of voltage required for a given temperature can be calculated using mathematical formulas such as the Navier-Stokes equations, the resistance-temperature characteristic curve, convection etc. in Ohm's law.

This heating can be initiated at very low temperatures, and there are no parts—such as active components for control purposes—required to reach a certain operating temperature in order to function. In contrast to a circuit board with a controlled heating device, which necessarily includes active components that must be first heated at low temperatures to even start the control, the PCB described here can begin to be heated, even at very low temperatures, without using any additional measures.

In general, no adjustment is necessary; any components such as microcontrollers, etc. that are necessary for control purposes are not required. The PTC thermistor is virtually able to "self-regulate," and external components are not required for this purpose.

There are preferably at least two heat conducting paths on the heating layer. These two paths can be controlled separately; in particular, different voltages may be applied to the at least two heat conductors. Thus, various electronic components can be heated differently. For example, a processor that generates heat itself may receive less heat than a passive component such as a coil would receive.

In a preferred embodiment, the circuit board comprises at least one electronic component on the component layer of the circuit board, wherein the electronic component is connected to the conductor path via an electrical contact. The heating conductor can thus heat the electronic component.

In an advantageous embodiment, the heating conductor extends below and/or above the electrical component. The component can thus be heated directly from below and/or above.

Alternatively, or additionally, the PCB comprises a thermal via that connects the heating layer to the component layer. The heat is thus connected directly to the component layer through the heating layer, and the heat is transported directly to this layer where it is needed.

In an advantageous embodiment, the thermal via is thermally conductive, but not electrically conductive. Although this requires a little more effort during production, the heating layer can be designed independently of any conductor paths because there is no electrically conductive path from the heating layer to the component layer. In other words, the conductive path and the heat conductive paths are independent of one another and can also be controlled independently.

Figure 1:
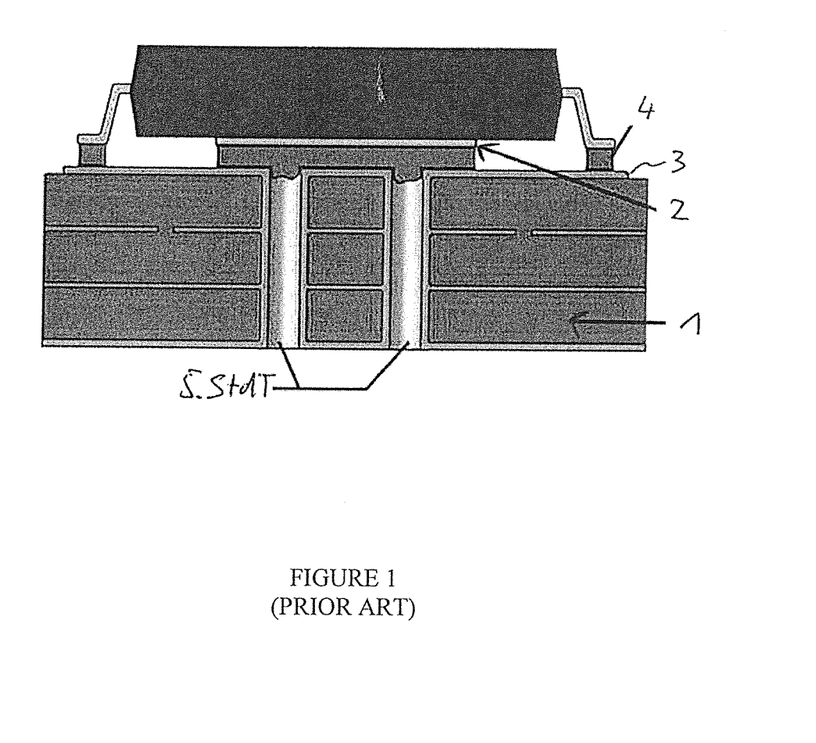
FIG. 1 illustrates thermal vias made from copper, which also form electrical paths.

The state of the art, described to a certain extent by the microcontroller manufacturer "Atmel", discloses thermal vias made from copper. In addition to the thermal path, it also forms an electrical path. The printed circuit board in FIG. 1 illustrates this. The electronic component 2 is connected to a conductive path 3 via a contact 4. The conductive path 3 extends below the component 2. The conductive path 3 can be connected via a thermal vias 5 to the side of the PCB 1 that is opposite to the component 2. The thermal via 5 can thus divert heat generated by the electronic component 2.

In order to bring the heat directly to the corresponding component to be heated, it is preferable for the thermal via to connect the heat conductor directly to electronic component on the component layer. The heat can thus be spread out over the heating conductor and the contact and be guided directly into the component.

Advantageously, the thermal via connects the heating conductor with a conductor area which contacts the electronic component. This could be a grounding plane, for example. Heat is then discharged from the conductor surface, just as the grounding plane, to the components.

To ensure safe operation of the component, the heating conductor on the heating layer heats the electronic component to its operating temperature, which must be at least −40° C.

Another aspect of this invention involves a plug-in module for a measuring instrument, comprising at least one circuit board as described as above. In order to better distribute the heat, the plug-in module comprises a structure having an extended surface, in particular a heatsink for dissipating the heat generated by the printed circuit board. "Heatsink" in this context means a structure with a heat-dissipating surface on a heat-producing component associated with the printed circuit board. In an advantageous embodiment, the above-described printed circuit board also comprises, in addition, or alternatively, a structure having an increased surface area functioning as a heatsink for dissipating the heat that is generated.

The heatsink has the task of diverting heat away from the PCB through heat conduction, then emitting it into the environment through heat radiation and convection. In order to keep the thermal resistance as low as possible, the heatsink material must be of good thermal conductivity, have a dark and large surface, and preferably be mounted vertically in order to promote air circulation through the "chimney effect." The heatsink comprises, for example, a highly thermally conductive metal, usually aluminum or copper. Alternatively, ceramic materials (aluminum oxide and aluminum nitride) may be used.

The objects of the invention may be further achieved by a field device comprising a circuit board as described above, and/or comprising a plug-in module as described above. The circuit board and/or the plug-in module can thus be part of the field device for heating the field device itself or parts of the field device. It is possible that the PCB or the plug-in module may heat up components or plug-in modules adjacent to the PCB.

The field device comprises a data processing unit, in particular a transmitter or a sensor.

Figure 2:
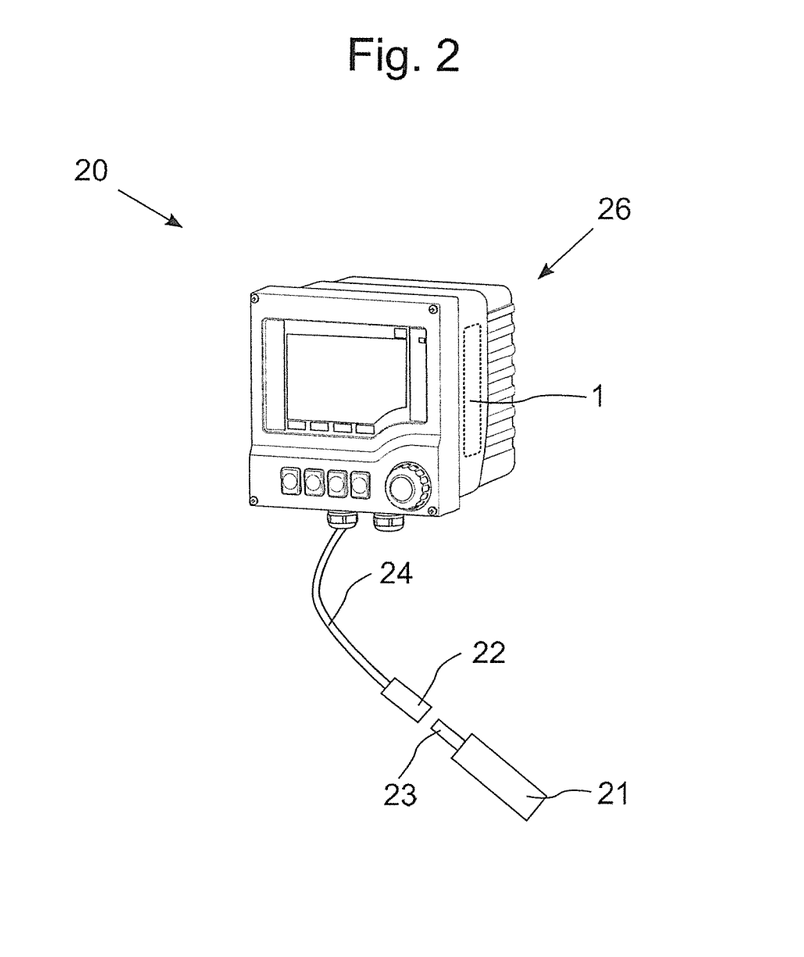
FIG. 2 shows a field device according to the invention comprising a printed circuit board including a sensor.

The printed circuit board according to the invention in its entirety has the reference numeral 1, and is shown in FIG. 2 as part of the field device 20, also according to the invention.

This description will first address an inventive field device 20 in which the circuit board of the invention 1 is used. The field device 20 includes a data processing unit 26 and/or a sensor 21. The sensor 21, in general, communicates via a first interface 23 with the data processing unit 26, such as a measuring converter (also referred to as a transmitter). At the transmitter 26, a cable 24 is provided, the other end of which includes a second interface 22 complementary to the first interface 23. The interfaces 22, 23 are configured as galvanically isolated and inductive interfaces that are coupled to one another by means of a mechanical plug connection. Data (bidirectional) and energy (unidirectional, that is from the transmitter 26 to the sensor 21) are sent via the interfaces 22, 23. The data is transmitted in digital form.

The field device 20 is used primarily in process automation. Sensor 21 therefore involves a pH, ORP, and ISFET, temperature, conductivity, pressure, oxygen, especially dissolved oxygen or carbon dioxide sensors; an ion-selective sensor; an optical sensor, in particular a turbidity sensor, a sensor for visually determining oxygen concentration or a sensor for determining the number of cells and cell structures; a sensor for monitoring certain organic or metallic compounds; a sensor for determining a concentration of a chemical substance such as a particular element or a particular link; or to a biosensor, e.g. a glucose sensor. Likewise, an insert in pressure, level, flow or temperature measuring points is possible.

The printed circuit board 1 according to the invention is located in the field device 20, in particular the transmitter 26 is configured as a two- or four-wire device. The Assignee hereof sells such products under such names as "Endress+Hauser Liquiline M CM42" and "Endress+Hauser Liquiline M CM448."

Figure 3A:
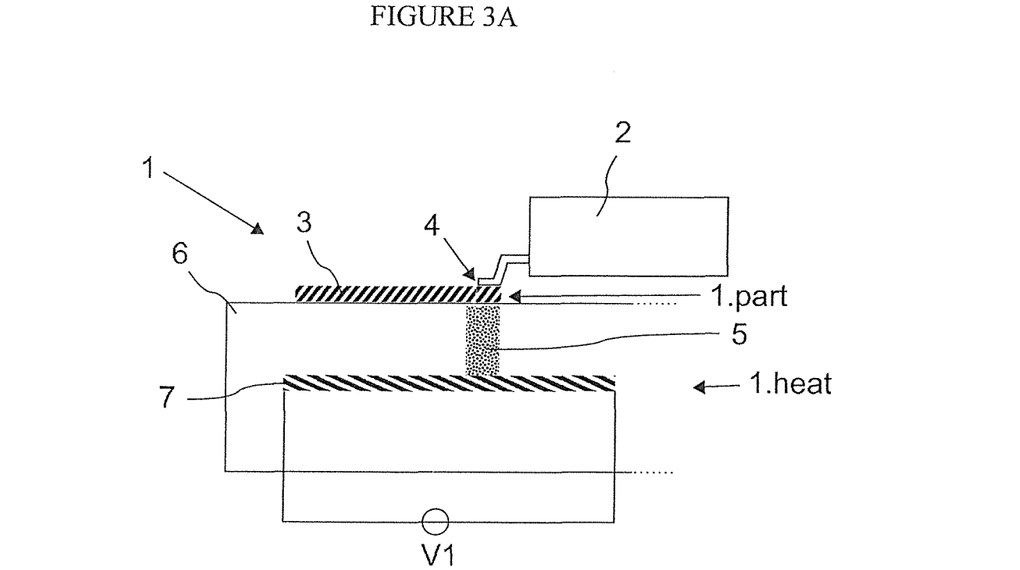
FIG. 3A shows a circuit board according to the invention in a cross section.
Figure 3B:
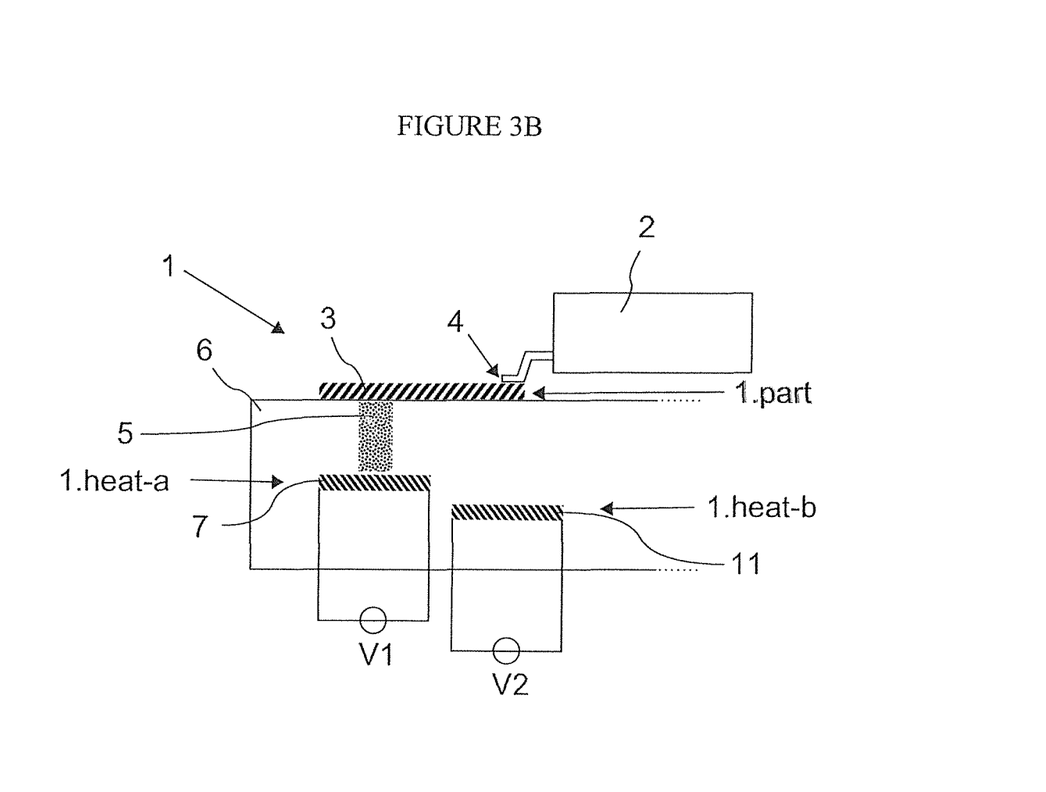
FIG. 3B depicts a different cross section of the PCB.

FIGS. 3A and 3B show a printed circuit board 1 of the invention in a cross section. The printed circuit board 1 comprises of an electrically insulating base material 6, such as FR4. Conductor paths 3 on the PCB are typically etched from a thin layer of copper. The figures also show an electronic component 2, which may be an active component such as an operational amplifier, a processor, microcontroller, FPGA, etc. The electronic device may also be a passive component such as a resistor, inductor or capacitor. The electronic component 2 is soldered to a conductor path 3 via a contact 4. The electronic component 2 is situated on the component layer 1.part. Usually the component layer 1.part is the top or bottom layer on the PCB (as shown in FIGS. 3A and 3B). The components can also be arranged on an inner layer of the PCB.

Heating layer 1.heat is shown as an inner layer of the PCB. Heating layer 1.heat comprises a heat-conducting path 7. As shown in FIG. 3b, a plurality of heat-conducting paths 7, 11 may be arranged on heating layer 1. The various heat-conducting paths 7, 11, however, do not necessarily have to be arranged on a single heating layer 1.heat, but rather, can be set up on different layers, such as 1.heat-a, 1.heat-b (as indicated in FIG. 3b). Although heating layer 1, heat is preferably an inner layer, it may also be the top or bottom layer of the PCB.

Voltages(s) V1, V2 can be applied to the heat-conducting paths 7, 11. The voltages V1 and V2 may be different, i.e. several heat-conducting paths 7, 11 can be controlled separately.

A PTC thermistor is included in the heat-conducting paths 7, 11. A PTC thermistor is also known as PTC resistor according to the term positive temperature coefficient. One example of this is barium titanate ($BaTiO_3$), which is a mixture of barium carbonate and titanium (IV) oxide. Alternatively, PTC thermistors are silicon-based.

The basic material can be used to transport a certain amount of heat from the heating layer 1.heat to the component layer 1.part. However, the base material is usually a thermal insulator. A thermal via 5 is therefore better suited for transporting heat generated by the heat-conducting path 7 from the heating layer 1.heat to the component layer 1.part. The thermal via 5 is thermally conductive, but electrically non-conductive. Thus it can be guaranteed that the circuit containing the heat-conducting path 7 is considered to be electrically independent of the conductor path 3 of the electronic component 2.

Figure 4:
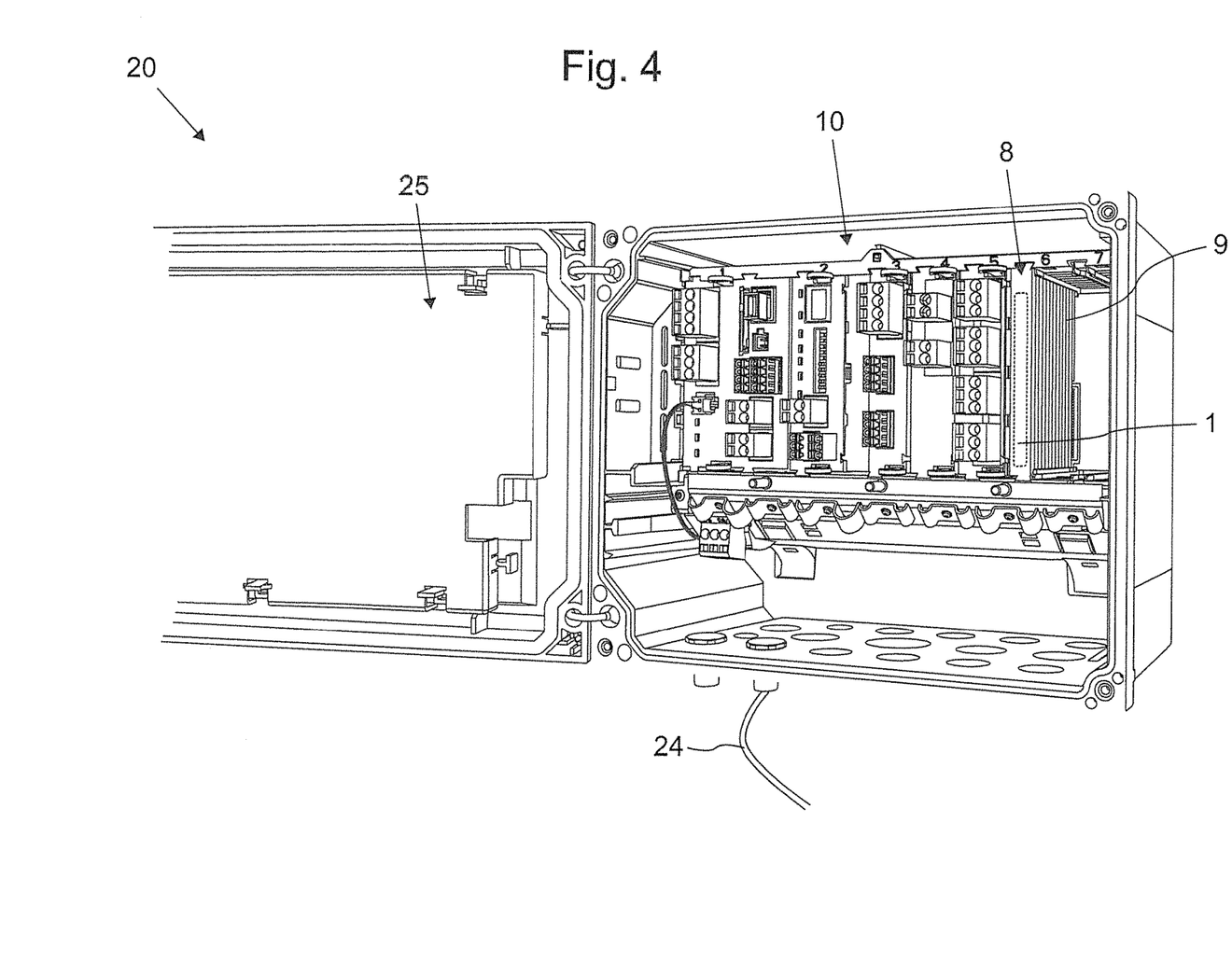
FIG. 4 illustrates a field device according to the invention in an embodiment with a plug-in module.

FIG. 4 shows the field device 20 according to the invention with the door 25 is open. Several plug-in modules 10 for different tasks are located on the interior of the transmitter 26. A first plug-in module is e.g. designed as a controller. As described above, additional plug-in modules 10 comprise inputs for measurement data from sensors. This is indicated in FIG. 4 through the cable 24 that leads at the lower end of the transmitter 26 to a sensor 21. Additional plug-in modules 10 are modules for relays and outputs, especially current outputs.

A plug-in module 8 according to the invention is shown on the right side in FIG. 4. The plug-in module 8 comprises a printed circuit board 1 of the invention, which includes a heat-conducting path 7 for generating and transporting heat. The plug-in module 8 may heat adjacent plug-in modules 10. This is quite useful when there is no room for a heat-conducting path 7 on the other plug-in module 10 itself.

The plug-in module 8 further includes a structure having an increased surface area, for example, a heatsink 9. In FIG. 4, the heatsink 9 is mounted on the right side of the plug-in module 8. The heatsink 9 may also be mounted on the opposite side of the plug-in module 8. The heatsink diverts heat that the heating layer 1.heat produced, which makes it easier to supply the adjacent plug-in modules 10 with heat.

The invention claimed is:

1. A printed circuit board (PCB), comprising: a base material including at least one electrically conductive path adapted to connect through an electrical contact to an electronic component on a component layer; at least one heat-conducting path forming a heating layer embedded in the base material for generating and conducting heat; wherein each heat-conducting path forms a positive temperature coefficient (PTC) thermistor or resistor; wherein a constant voltage is applied to each heat-conducting path; and wherein the applied constant voltage results in a corresponding flow of electrical current that heats the PCB to a temperature specific to the applied constant voltage, until a balance is reached between the amount of heat generated and dissipated, resulting in a self-control of the PCB temperature.

2. The printed circuit board according to claim 1, including at least two, separately controlled heat-conducting paths.

3. The printed circuit board according to claim 1, including heat-conducting paths positioned below and/or above the component layer.

4. The printed circuit board according to claim 1, including a thermal via connecting at least one of the heat-conducting paths to the component layer.

5. The printed circuit board according to claim 4, including the thermal via that is thermally conductive but not electrically conductive.

6. The printed circuit board according to claim 4, including the thermal via that directly connects a heat-conducting path to the electrical contact.

7. The printed circuit board according to claim 4, including the thermal via that connects a heat-conducting path to a conductive surface that makes contact with the electronic component.

8. The printed circuit board according to claim 1, wherein the heat-conducting path heats the electronic component to its lowest operating temperature.

9. The printed circuit board according to claim 1, wherein the heat-conducting path heats the electronic component to an operating temperature of −40° C.

10. The printed circuit board according to claim 1, further comprising a heatsink for radiating the heat produced by the printed circuit board.

11. A field device, comprising: at least one plug-in module including a printed circuit board (PCB) composed of a base material including at least one electrically conductive path adapted to connect through an electrical contact to an electronic component on a component layer; at least one heat-conducting path forming a heating layer embedded in the base material of the PCB for generating and conducting heat; wherein each heat-conducting path forms a positive temperature coefficient (PTC) thermistor or resistor; and wherein a constant voltage is applied to each heat-conducting path; and wherein the applied constant voltage results in a corresponding flow of electrical current that heats the PCB to a temperature specific to the applied constant voltage, until a balance is reached between the amount of heat generated and dissipated, resulting in a self-control of the PCB temperature.

12. The field device according to claim 11, wherein the PCB includes at least two, separately controlled heat-conducting paths.

13. The field device according to claim 11, wherein the PCB includes heat-conducting paths positioned below and/or above the component layer.

14. The field device according to claim 11, wherein the PCB includes a thermal via connecting at least one of the heat-conducting paths to the component layer.

15. The field device according to claim 14, wherein the PCB includes the thermal via that is thermally conductive but not electrically conductive.

16. The field device according to claim 14, wherein the PCB includes the thermal via that directly connects a heat-conducting path to the electrical contact.

17. The field device according to claim 14, wherein the PCB includes the thermal via that connects a heat-conducting path to a conductive surface that makes contact with the electronic component.

18. The field device according to claim 11, wherein the heat-conducting path of the PCB heats the electronic component to its lowest operating temperature.

19. The field device according to claim 11, wherein the heat-conducting path of the PCB heats the electronic component to an operating temperature of −40° C.

20. The field device according to claim 11, wherein the PCB a heatsink for radiating the heat produced by the PCB in to the field device.

21. The field device according to claim 11, further comprising one or more of the following:
- a data processing unit;
- a transmitter; and
- a sensor.

* * * * *

UNITED STATES PATENT AND TRADEMARK OFFICE
CERTIFICATE OF CORRECTION

PATENT NO. : 9,693,446 B2
APPLICATION NO. : 14/566126
DATED : June 27, 2017
INVENTOR(S) : Thomas Ragg It is certified that error appears in the above-identified patent and that said Letters Patent is hereby corrected as shown below:

In the Claims

Column 8, Lines 33-48, Claim 11 should read:
11. A field device, comprising:
at least one plug-in module including a printed circuit board (PCB) composed of a base material including at least one electrically conductive path adapted to connect through an electrical contact to an electronic component on a component layer;
at least one heat-conducting path forming a heating layer embedded in the base material of the PCB for generating and conducting heat;
wherein each heat-conducting path forms a positive temperature coefficient (PTC) thermistor or resistor; and
wherein a constant voltage is applied to each heat-conducting path; and
wherein the applied constant voltage results in a corresponding flow of electrical current that heats the PCB to a temperature specific to the applied constant voltage, until a balance is reached between the amount of heat generated and dissipated, resulting in a self-control of PCB temperature.

Signed and Sealed this
Third Day of October, 2017

Joseph Matal
*Performing the Functions and Duties of the
Under Secretary of Commerce for Intellectual Property and
Director of the United States Patent and Trademark Office*